(12) United States Patent (10) Patent No.: US 7,611,640 B1
Howald et al. (45) Date of Patent: Nov. 3, 2009

(54) MINIMIZING ARCING IN A PLASMA PROCESSING CHAMBER

(75) Inventors: Arthur M Howald, Pleasanton, CA (US); Andras Kuthi, Thousand Oaks, CA (US); Andrew D. Bailey, III, Pleasanton, CA (US); Butch Berney, Pleasanton, CA (US)

(73) Assignee: Lam Research Corporation, Fremont, CA (US)

( * ) Notice: Subject to any disclaimer, the term of this patent is extended or adjusted under 35 U.S.C. 154(b) by 406 days.

(21) Appl. No.: 11/396,124

(22) Filed: Mar. 30, 2006

Related U.S. Application Data

(62) Division of application No. 10/140,618, filed on May 6, 2002, now Pat. No. 7,086,347.

(51) Int. Cl.
*C23F 1/00* (2006.01)
*H01L 21/3065* (2006.01)

(52) U.S. Cl. .................................. 216/67; 156/345.43

(58) Field of Classification Search ............ 156/345.43, 156/345.48; 216/63, 67
See application file for complete search history.

(56) References Cited

U.S. PATENT DOCUMENTS

| | | | |
|---|---|---|---|
| 5,240,584 A | 8/1993 | Szcyrbowski et al. | |
| 5,705,019 A | 1/1998 | Yamada et al. | |
| 5,880,924 A | 3/1999 | Kumar et al. | |
| 5,904,571 A | 5/1999 | Patrick et al. | |
| 5,904,778 A | 5/1999 | Lu et al. | |
| 5,909,994 A | 6/1999 | Blum et al. | |
| 5,910,221 A | 6/1999 | Wu et al. | |
| 6,041,734 A * | 3/2000 | Raoux et al. ............. | 118/723 E |
| 6,114,252 A | 9/2000 | Donohoe et al. | |
| 6,129,808 A | 10/2000 | Wicker et al. | |

6,227,140 B1    5/2001   Kennedy et al.

(Continued)

FOREIGN PATENT DOCUMENTS

EP    0783175 A2    9/1997

(Continued)

OTHER PUBLICATIONS

XP002254799, Oct. 7, 1985, Asahi Glass Co LTD, abstract only.

(Continued)

*Primary Examiner*—Parviz Hassanzadeh
*Assistant Examiner*—Maureen Gramaglia
(74) *Attorney, Agent, or Firm*—IP Strategy Group, P.C.

(57) ABSTRACT

A plasma processing chamber for processing a substrate to form electronic components thereon is disclosed. The plasma processing chamber includes a plasma-facing component having a plasma-facing surface oriented toward a plasma in the plasma processing chamber during processing of the substrate, the plasma-facing component being electrically isolated from a ground terminal. The plasma processing chamber further includes a grounding arrangement coupled to the plasma-facing component, the grounding arrangement including a first resistance circuit disposed in a first current path between the plasma-facing component and the ground terminal. The grounding arrangement further includes a RF filter arrangement disposed in at least one other current path between the plasma-facing component and the ground terminal, wherein a resistance value of the first resistance circuit is selected to substantially eliminate arcing between the plasma and the plasma-facing component during the processing of the substrate.

33 Claims, 8 Drawing Sheets

U.S. PATENT DOCUMENTS

| | | | |
|---|---|---|---|
| 6,308,654 | B1 | 10/2001 | Schneider et al. |
| 6,624,084 | B2 | 9/2003 | Maeda et al. |
| 2001/0003271 | A1* | 6/2001 | Otsuki .................... 118/723 I |
| 2002/0093148 | A1* | 7/2002 | Golovato et al. ............ 277/641 |

FOREIGN PATENT DOCUMENTS

| | | |
|---|---|---|
| EP | 845800 A1 | 6/1998 |
| EP | 887835 A2 | 12/1998 |
| JP | 62-8408 | 1/1987 |
| JP | 04-291915 | 10/1992 |
| JP | 04291915 | 10/1992 |
| JP | 05234697 A | 9/1993 |
| JP | 0-6037051 | 2/1994 |
| JP | 06037051 A | 2/1994 |
| JP | 2001185542 A | 7/2001 |

OTHER PUBLICATIONS

Ra et al., "Direct current bias as an ion current monitor in the transformer coupled plasma etcher," Nov./Dec. 1993, Jrnl of Vac Sc and Tech, pp. 2911-2913.

International Search Report, mailed Sep. 29, 2003, PCT/US03/13597 for U.S. Appl. No. 10/140,618.

"Notice of Office Action," Mailed Dec. 14, 2005, U.S. Appl. No. 10/140,618, Inventor: Howald et al., filed May 6, 2002.

"Notice of Office Action," Mailed Jun. 15, 2005, U.S. Appl. No. 10/140,618, Inventor: Howald et al., filed May 6, 2002.

"Notice of Office Action," Mailed Jun. 23, 2004, U.S. Appl. No. 10/140,618, Inventor: Howald et al., filed May 6, 2002.

* cited by examiner

MINIMIZING ARCING IN A PLASMA PROCESSING CHAMBER

This application is a divisional of and claims priority under 35 U.S.C § 120 to a patent application entitled "Apparatus And Methods For Minimizing Arcing In A Plasma Processing Chamber," U.S. Ser. No. 10/140,618, filed May 6, 2002, now U.S. Pat. No. 7,086,347 which is incorporated herein by reference.

BACKGROUND OF THE INVENTION

The present invention relates to apparatus and methods for processing substrates, such as semiconductor substrates for use in IC fabrication or glass panels for use in flat panel display fabrication. More particularly, the present invention relates to improved methods and apparatus for minimizing, during processing, arcing between a plasma-facing component associated with a plasma processing chamber and the plasma present therein and/or with another plasma-facing component.

Plasma processing systems have been around for some time. Over the years, plasma processing systems utilizing inductively coupled plasma sources, electron cyclotron resonance (ECR) sources, capacitive sources, and the like, have been introduced and employed to various degrees to process semiconductor substrates and glass panels.

During processing, multiple deposition and/or etching steps are typically employed. During deposition, materials are deposited onto a substrate surface (such as the surface of a glass panel or a wafer). For example, deposited layers comprising various forms of silicon, silicon dioxide, silicon nitride, metals and the like may be formed on the surface of the substrate. Conversely, etching may be employed to selectively remove materials from predefined areas on the substrate surface. For example, etched features such as vias, contacts, or trenches may be formed in the layers of the substrate. Note that some etch processes may utilize chemistries and/or parameters that simultaneously etch and deposit films on the plasma-facing surfaces.

The plasma can be generated and/or sustained using a variety of plasma generation methods, including inductively-coupled, ECR, microwave and capacitively-coupled plasma methods. In an inductively-coupled plasma processing chamber, for example, an inductive source is employed to generate the plasma. To facilitate discussion, FIG. 1 illustrates a prior art inductive plasma processing chamber 100, which is configured for etching in this example. Plasma processing chamber 100 includes a substantially cylindrical chamber wall portion 102 and an antenna or inductive coil 104 disposed above a dielectric window 106. Typically, antenna 104 is operatively coupled to a first RF power source 108, which may include a RF generator 110 and a RF match network 112 as shown. RF generator 110 may operate at a frequency of, for example 4 MHz. Generally speaking, the RF signals from the RF generators may be sinusoidal, pulsed, or non-sinusoidal. Dielectric window 106 is typically formed of a high resistivity dielectric material, such as high resistivity silicon carbide (SiC).

Within plasma processing chamber 100, a set of inlet gas ports (not shown) is typically provided to facilitate the introduction of gaseous source materials, e.g., the etchant source gases, into the RF-induced plasma region between dielectric window 106 and a substrate 114. Substrate 114 is introduced into chamber 100 and disposed on a chuck 116. Chuck 116 generally acts as an electrode and is operatively coupled to a second RF power source 118, which may include a RF generator 120 and a RF match network 122 as shown. RF generator 120 may operate at a RF frequency of, for example, 13.56 MHz. As mentioned, the RF signal from RF generator 120, like other RF signals from the RF generators, may be sinusoidal, pulsed, or non-sinusoidal.

In order to create a plasma, a process source gas is input into chamber 100 through the aforementioned set of inlet gas ports. Power is then supplied to inductive coil 104 using RF power source 108 and to chuck 116 using RF power source 118. The supplied RF energy from RF power source 108 coupled through dielectric window 106 excites the process source gas and a plasma 124 is generated thereby.

A focus ring 126 may be provided in certain chamber configurations. As is well known to those familiar with the plasma processing art, the focus ring helps focus the ions from plasma 124 onto the surface of substrate 114 to, for example, improve process uniformity. Focus ring 126 also protects a portion of chuck 116 from damage during processing. A plasma screen 128 may also be provided in certain chamber configurations to help contain the plasma and to prevent plasma leakage into non-active areas of the chamber, such as areas below chuck 116. Such leakage may cause premature corrosion and/or result in the inappropriate deposition of unwanted materials on certain chamber parts.

A plurality of magnets 130 may be disposed around the circumference of chamber wall 102. These magnets may be employed, for example, to facilitate control of etch rate uniformity. Chamber 100 may also be provided with different components, depending on the specific manufacturer thereof and/or the requirements of a particular etch process. For example, pressure control rings, hot edge rings, various gas injector nozzles, probes, chamber liners, etc., may also be provided. To simplify the illustration, these well-known components are omitted from FIG. 1.

Generally speaking, it is critical to maintain tight control of the etch process in order to obtain a satisfactory etch result. Thus, parameters such as the RF voltage, RF power, bias voltage, bias power, plasma density, the amount of contamination in the chamber, and the like, must be carefully controlled. In this regard, the design of the plasma processing chamber, and in particular the design of the plasma-facing components, is tremendously important. As the term is employed herein, a plasma-facing component represents a component that has at least one surface exposed to or facing the plasma during processing. In general, the plasma-facing components in the chamber must be carefully selected in order to obtain the desired combination of reasonable cost, appropriate mechanical strength, compatibility with the etch chemistry, low contamination, appropriate electrical properties, and others.

For example, aluminum, anodized aluminum, or one of the aluminum alloys has long been employed to fabricate plasma-facing components. Although aluminum is relatively inexpensive and easy to fabricate, it suffers from chemical incompatibility with certain etch processes, such as those involved in etching aluminum layers on the substrate surface. Even with an anodized coating or some other coatings, the risk of contamination due to the unwanted presence of aluminum-containing particles in the chamber makes aluminum unacceptable in certain applications. Such aluminum-containing particles may cause unwanted deposition of contaminants on the substrate being processed, or may be incorporated into the polymer deposition along the chamber sidewalls, rendering the chamber cleaning task more difficult and more time-consuming to perform.

Other materials such as silicon carbide (SiC) possess different chemical characteristics, and may thus be employed to fabricate plasma-facing components although the use of SiC may involve trade-offs in cost, electrical properties, and/or mechanical properties. Some materials may have the right chemical and electrical properties but may, for example, be very difficult and/or expensive to fabricate and/or to produce with the requisite degree of purity. Thus, no material is perfect for every application, and one that is chemically compatible and results in low contamination often suffers from other deficiencies, such as undesirable electrical properties. Accordingly, manufacturers constantly try to balance various factors in selecting the "right" material for these plasma-facing components for use in different processing applications It is observed by the inventors herein that at certain RF power settings in certain processes, arcing may occur between the plasma, such as plasma 124 of FIG. 1, and a plasma-facing surface of a plasma-facing component. Arcing appears to occur irrespective of whether the plasma-facing surface is in direct contact with the observable plasma cloud of plasma 124. In some cases, if the plasma-facing component is formed of a material having a relatively low resistivity, arcing appears to be more pronounced during certain phases of the process. These low resistivity materials may include, for example, aluminum, stainless steel, various alloys of aluminum and/or stainless steel, low resistivity silicon carbide (SiC), silicon (Si), boron carbide (B4C), graphite (C), and the like. Low resistivity materials are sometimes favored in the fabrication of certain plasma-facing components, such as the chamber wall, because the low resistivity materials appear to be more efficient at containing the RF energy within the chamber. It is also observed that in certain etch processes that cause polymer deposition on a plasma-facing surface, arcing seems to be more pronounced during certain phases of the process.

Arcing is a serious problem, as it detrimentally degrades the process result. For example, FIG. 2 is a graph of the 431 nm optical emission of the plasma during an exemplary etch process in which arcing is observed. As indicated by the transient spikes 202A and 202B in the optical emission signal, the plasma behaves unpredictably during arcing, thus yielding in an unacceptable etch result. Furthermore, the arcing sometimes sputters particles from the plasma-facing surface into the chamber interior, resulting in unwanted contamination at unpredictable times. Still further, arcing causes damage, often serious damage, either immediately or over time to the plasma-facing surface of the plasma-facing component.

For example, FIG. 3 shows a photograph of the interior surface of a silicon carbide plasma-facing component damaged by arcing. In this case, the pattern of the arc tracks 302 is influenced by the magnetic fields associated with the radially disposed magnets that surround the exterior circumference of the chamber wall. It should be pointed out that the magnets happen to be part of the chamber within which the photograph of FIG. 3 was taken; however, the presence or absence of magnets appears not to be a determinant as to whether arcing would occur. The SiC particles displaced from the chamber wall along the arc tracks are introduced into the chamber interior as contaminants. The pitting caused by arc tracks 302 on the chamber wall interior necessitates chamber wall replacement, which is an expensive and time-consuming process and an unwanted interruption in the utilization of the plasma processing chamber in the production of semiconductor products.

Of course, one obvious approach to control arcing would be to simply ground the plasma-facing component, by connecting the plasma-facing component directly to ground. Despite many attempts, directly connecting the plasma-facing component to ground does not always solve the problem. Another approach to control arcing would be to modify other process parameters, such as the RF voltages and RF powers of the various RF power sources. However, this is not always possible since many processes require that certain parameters be kept within a certain range. Still another approach to control arcing would be to select a material having different electrical properties for the plasma-facing components. However, this is also not always a desirable solution since a different material may introduce a different set of problems, such as incompatible chemical properties, increased contamination, increased cost of fabrication, low mechanical strength, and the like.

In view of the foregoing, there are desired improved methods and apparatus for reducing and/or eliminating arcing between a plasma-facing component associated with a plasma processing chamber and the plasma present during processing. Preferably, the techniques for reducing and/or eliminating arcing would be adaptable to any type of material that may be employed to fabricate the plasma-facing components.

SUMMARY OF THE INVENTION

The invention relates, in one embodiment, to a plasma processing chamber for processing a substrate to form electronic components thereon. The plasma processing chamber includes a plasma-facing component having a plasma-facing surface oriented toward a plasma in the plasma processing chamber during processing of the substrate, the plasma-facing component being electrically isolated from a ground terminal. The plasma processing chamber further includes a grounding arrangement coupled to the plasma-facing component, the grounding arrangement including a first resistance circuit disposed in a first current path between the plasma-facing component and the ground terminal. The grounding arrangement further includes a RF filter arrangement disposed in at least one other current path between the plasma-facing component and the ground terminal, wherein a resistance value of the first resistance circuit is selected to substantially eliminate arcing between the plasma and the plasma-facing component during the processing of the substrate.

In another embodiment, the invention relates to a method for configuring a plasma processing chamber for processing a substrate to form electronic components thereon. The method includes providing a plasma-facing component having a plasma-facing surface oriented toward a plasma in the plasma processing chamber during the processing of the substrate. The method further includes electrically isolating the plasma-facing component from a ground terminal. The method additionally includes coupling the plasma-facing component to a grounding arrangement, the grounding arrangement comprising a first resistance circuit disposed in a first current path between the plasma-facing component and the ground terminal.

In yet another embodiment, the invention includes a grounding arrangement configured to substantially eliminate arcing between a plasma-facing component associated with a plasma processing chamber and a plasma within the plasma processing chamber. The plasma is present during processing of a substrate to form electronic components thereon. The plasma-facing component has a plasma-facing surface that is oriented toward the plasma during the processing. The plasma-facing component is electrically isolated from a ground terminal. The grounding arrangement includes a resistance circuit configured to be disposed in a first current path between the plasma-facing component and the ground terminal when the grounding arrangement is coupled to the plasma-facing component and the ground terminal, wherein a resistance value of the resistance circuit is selected to substantially eliminate arcing between the plasma and the plasma-facing component during the processing of the substrate.

In yet another embodiment, the invention relates to a method for configuring a plasma processing chamber for processing a substrate to form electronic components thereon. The method includes electrically isolating the substrate from a ground terminal during the processing. The method further includes coupling the substrate to a grounding arrangement during the processing. The grounding arrangement includes a first resistance circuit disposed in a first current path between the substrate and a ground terminal.

These and other features of the present invention will be described in more detail below in the detailed description of the invention and in conjunction with the following figures.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION OF THE PREFERRED EMBODIMENTS

The present invention will now be described in detail with reference to a few preferred embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps and/or structures have not been described in detail in order to not unnecessarily obscure the present invention.

Figure 2:
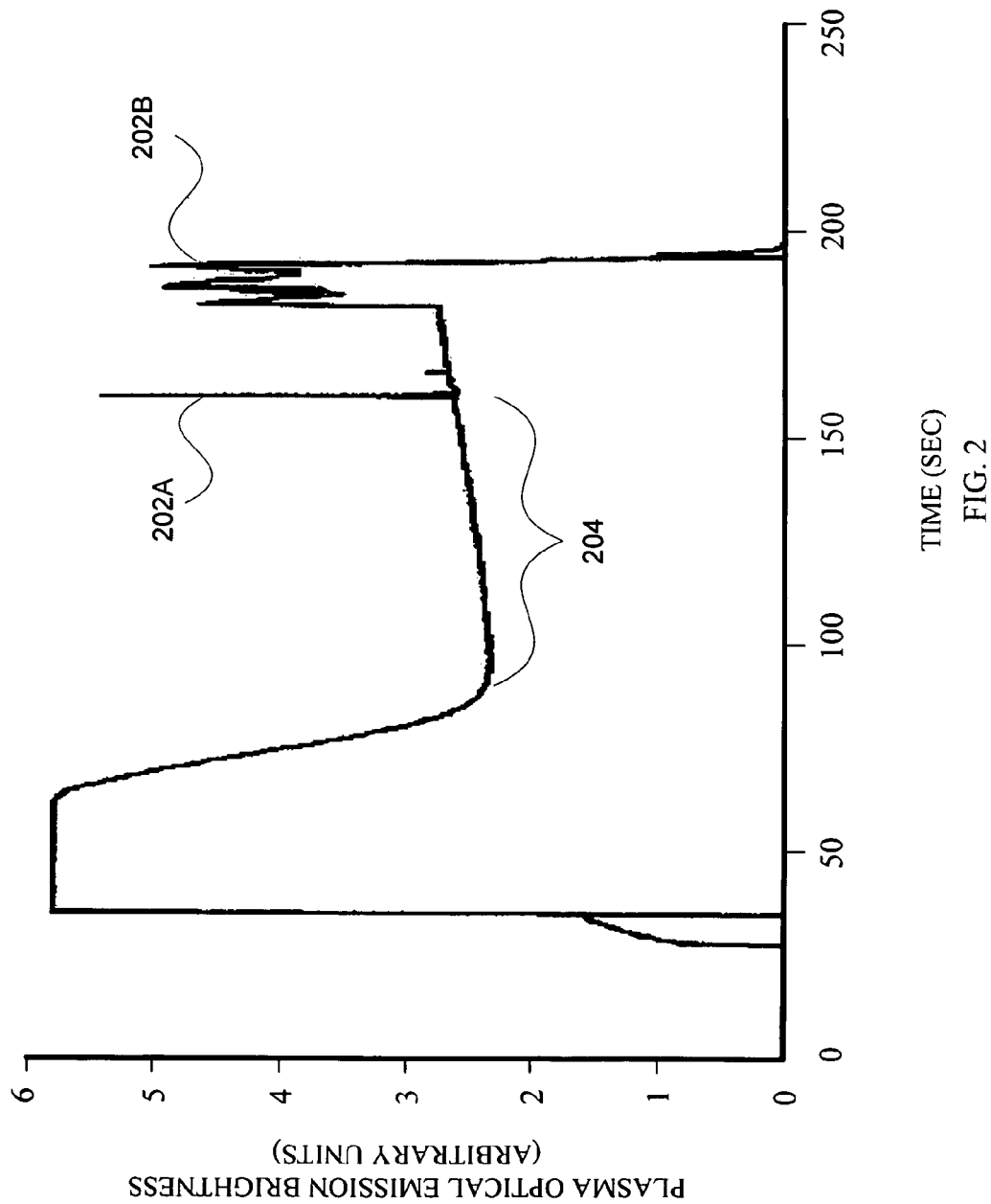
FIG. 2 is a graph of the optical emission of the plasma during an exemplary etch process in which arcing is observed
Figure 3:
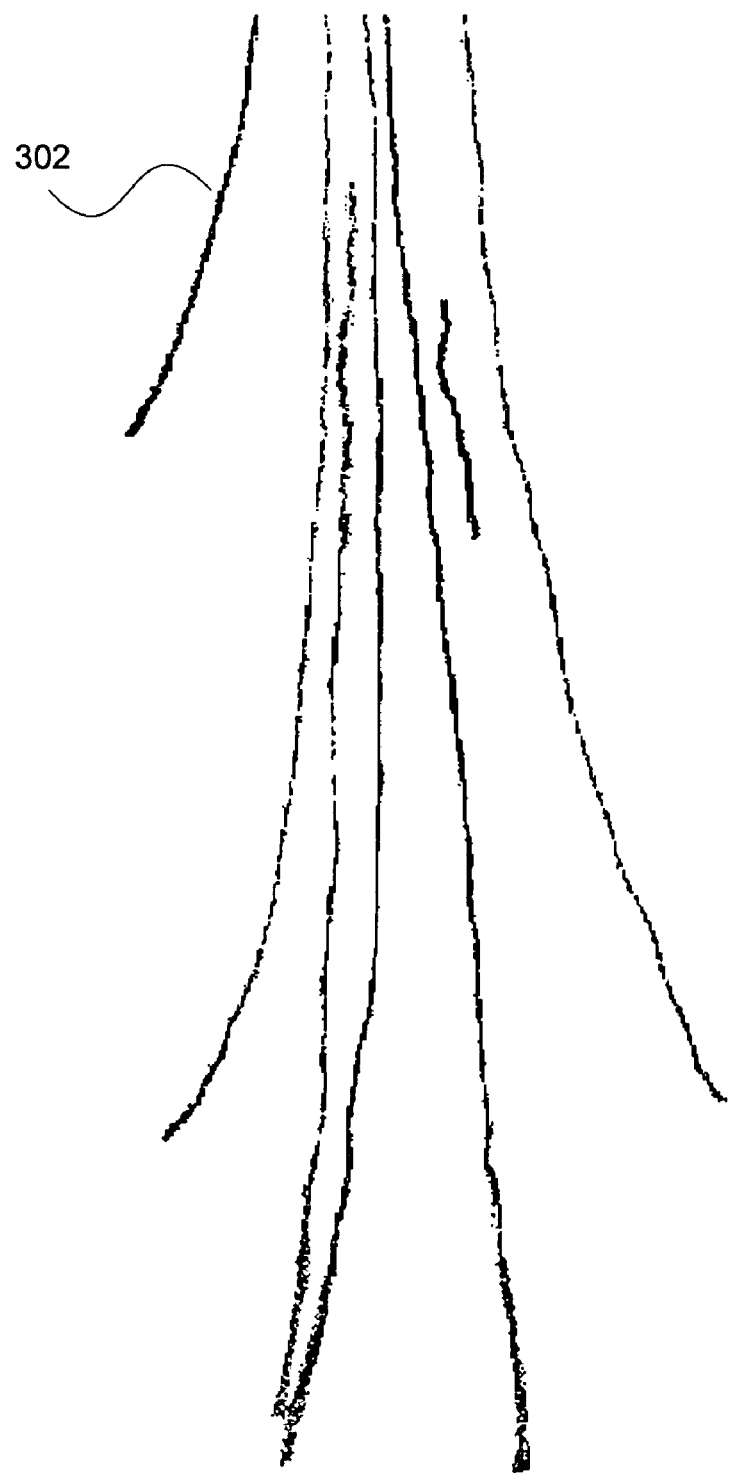
FIG. 3 shows a photograph of the interior surface of a silicon carbide plasma-facing component damaged by arcing

The invention relates, in one embodiment, to an arc-eliminating (AE) arrangement for eliminating arcing between a plasma-facing component and the plasma in a plasma processing chamber. While not wishing to be bound by theory, it is believed that arcing occurs because a sufficiently high DC potential is allowed to build up across a dielectric layer, such as the polymer layer deposited during processing. This theory is supported, in part, by the behavior of the observed optical emission of the plasma in FIG. 2. With reference to FIG. 2, for example, during the period referenced by reference number 204, there is no arcing and the optical emission is stable. The transient spikes 202A and 202B in the optical emission signal represent arcing, which occurs some time after the process has been underway. It is believed that at the beginning of the etch process of FIG. 2, the low resistivity SiC of the chamber wall (i.e., the plasma-facing component that experiences arcing later in this example) provides a current path to ground for the plasma DC voltage. Thus no arcing occurs at the beginning of the period marked by reference number 204.

As the processing continues, the polymer deposition builds up gradually during the period marked by reference number 204. As the polymer layer is built up along the sidewall, this polymer layer gradually cuts off the conduction path between the plasma through the low resistivity SiC material to ground. Thus, a DC potential difference builds up across the deposited polymer layer, and the DC potential difference increases as the layer grows thicker over time. At some point, the DC potential across the deposited polymer layer becomes sufficiently high for arcing to occur across the deposited polymer layer. At that point, the arc essentially blasts its way through the deposited polymer layer and damages the underlying SiC chamber wall inner surface.

The inventors also realized that this theory may also help explain why arcing sometimes occurs for certain processes at certain RF voltage and power regimes in a chamber that employs an anodized aluminum chamber. Anodized aluminum has a higher degree of hardness and is more chemically inert than the bulk aluminum material. However, while the bulk aluminum material of the chamber wall is highly conductive, the anodized aluminum coating that faces the plasma is more insulative. In one sense, the anodized aluminum coating performs the same function as the deposited polymer layer in the example of FIG. 2, i.e., the insulative anodized aluminum coating restricts the current path from the plasma through the bulk aluminum material of the chamber wall to ground. Thus, at certain RF voltage and power regimes, the DC potential difference across the anodized aluminum coating causes arcing to occur.

It is further realized that for certain processes, it is impractical to vary process parameters such as the RF voltages and the RF power settings (for the upper and/or lower RF power sources) beyond a certain process window. That is, certain etch or deposition processes can only be successfully performed if the RF voltages and the RF power settings are kept within a given window. Thus, varying the RF voltages and power settings beyond the permissible window in order to eliminate arcing may not be an option in some processes. What is required, thus, is a different way to address the arcing problem.

Furthermore, it is also not always advantageous to change the composition of the plasma-facing component, such as the chamber wall, solely in order to control arcing. This is because many times, the choice of materials for the plasma-facing component is dictated by considerations other than the electrical properties of the materials. For example, a certain material may be very desirable based on cost considerations, and/or based on the fact that its use causes very little contamination to occur inside the plasma processing chamber, and/or because that material has a superior resistant to the process chemistry, and/or because that material has superior mechanical properties. If one can solve the arcing problem by modifying the electrical properties of the plasma-facing component without requiring the use of a different material, it is possible to increase the variety of materials that can be employed to fabricate the plasma-facing component. This opens up a whole class of materials for use in fabricating plasma-facing components whereas these materials may have been rejected in the past for their poor electrical properties with respect to arcing.

Returning to the theory of arcing, it is realized then that simply grounding the plasma-facing component, i.e., directly connecting the plasma-facing component to ground using a conductor, will not reduce the DC potential difference across the deposited polymer layer and/or any dielectric layer and/or dielectric region between the plasma and the plasma-facing component. What is required then is a technique that artificially raises the DC potential of the plasma-facing component so that when the polymer deposition occurs or if the process is executed at certain RF voltages and RF power settings, the DC voltage difference between the plasma and the plasma-facing component is never allowed to reach the point where arcing would occur.

In order to achieve the foregoing, it is important to electrically isolate the plasma-facing component from the ground potential. In real-world terms, since a plasma-facing component, such as the chamber wall, is typically attached to the grounded frame of the plasma processing tool using conductive metal fasteners (e.g., stainless steel screws, bolts, clips, and the like), it is important to devise ways to fasten such plasma-facing component to the grounded frame of the plasma processing tool such that a direct electrical short to ground does not exist. One skilled in the art will readily appreciate that there are myriads of ways to mechanically fasten parts together while keeping them electrically isolated from one another. One such fastening method is discussed later herein in connection with FIG. 7 herein.

Figure 4A:
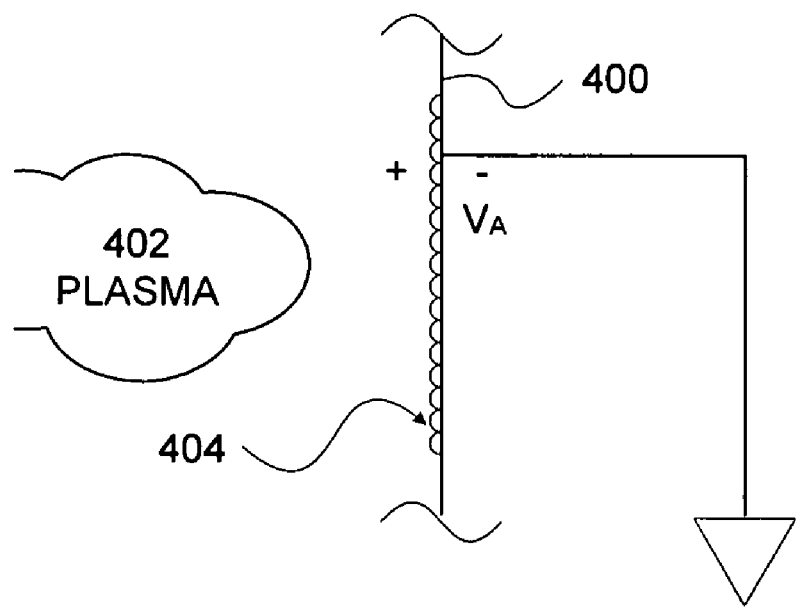
FIGS. 4A and 4B illustrate the function of the resistance circuitry in eliminating arcing.
Figure 4B:
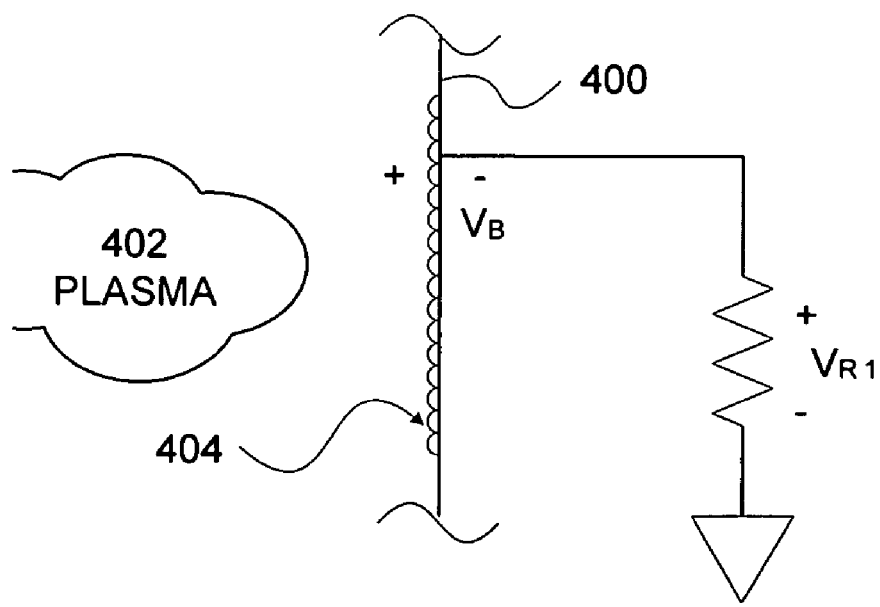

Once the plasma-facing component is electrically isolated from ground, an appropriately constructed AE circuit is then employed to artificially raise the DC voltage of the plasma-facing component above the ground potential during processing. For example, an appropriately-sized resistance circuitry would accomplish the requisite task of eliminating arcing once the plasma-facing component is electrically isolated from ground. The resistance circuitry should be carefully selected to elevate the DC voltage of the plasma-facing component to the point where the DC potential difference between the plasma and the plasma-facing component across a dielectric region (such as the aforementioned deposited polymer layer or anodized aluminum coating) is insufficient to cause arcing, FIGS. 4A and 4B illustrate the function of the resistance circuitry in eliminating arcing. In the situation of FIG. 4A, if the chamber wall 400 (representing the plasma-facing component in this example) is directly coupled to ground, the entire DC potential difference between the plasma 402 and ground will be concentrated across the dielectric region 404. It is believed that this DC potential difference, denoted by VA in FIG. 4A, will cause arcing under certain conditions (e.g., once the deposited polymer layer thickens sufficiently or under certain RF voltage and RF power regimes).

Figure 1:
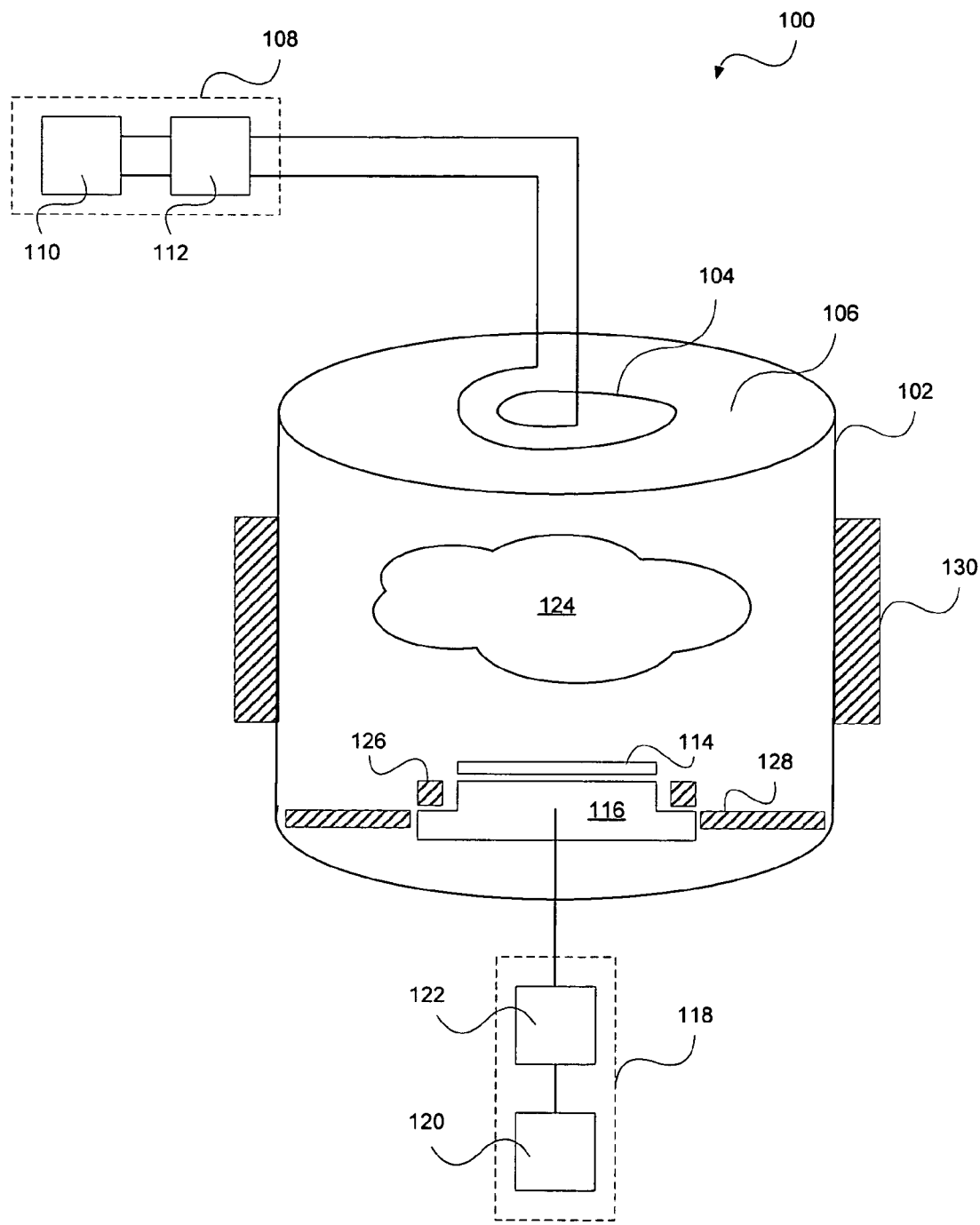
FIG. 1 illustrates a prior art inductively-coupled plasma processing chamber to facilitate discussion.

In the situation of FIG. 4B, the chamber wall is electrically isolated from ground, and an appropriately-sized resistor R1 is deliberately inserted in the current path between the plasma-facing component and ground. The presence of the resistance circuitry R1 causes the DC potential difference VA of FIG. 1 to be distributed between VR1 and VB in this case, wherein VR1 represents the DC voltage drop across resistor R1 and VB represents the DC voltage difference between the plasma and the plasma-facing component across dielectric region 404. By choosing an appropriate resistance value for R1 such that VR1 is sufficiently large and thus VB becomes sufficiently small under conditions that may otherwise cause arcing, arcing can be prevented.

Electrically isolating the plasma-facing component from ground and deliberately introducing a resistance circuit into the DC current path between the plasma-facing component and ground appears to substantially reduce the tendency to arc. However, the electrical isolation of the plasma-facing component and the introduction of a resistance circuit into the DC current path may cause other problems under certain conditions. For example, it is known that one must keep the level of radio frequency (RF) radiation output by the plasma-facing component to an acceptable level at all times. Containing the RF energy is important since a high level of RF radiation may cause an undue amount of interference with other electronic devices and may be prohibited by regulations.

If the plasma-facing component were directly connected to ground, as in the case of FIG. 4A, a low impedance path for the RF signal is already provided by the grounding conductor, and one needs to do nothing. However, since a relatively high impedance resistance circuit is required to raise the ground-isolated plasma-facing component closer to the plasma voltage, as in the example of FIG. 4B, an alternative low impedance RF path must be provided if RF containment is required.

In accordance with another aspect of the present invention, there is provided an RF filter for providing a low impedance path to ground for RF signals to minimize RF radiation at certain frequencies. In the preferred embodiment, a capacitance circuit is employed as the RF filter. The RF filter may be designed to act substantially like an open circuit to the DC signal, thus continuing to allow the DC voltage of the plasma-facing component to be kept off the ground potential (through the use of the resistance circuit). To an RF signal, however, the RF filter may be designed to act substantially like a closed circuit, thereby providing a low impedance path to ground for RF signals.

In one embodiment, the RF filter is implemented by an appropriately sized capacitor connected so as to provide an independent low impedance path to ground for the RF signal (s) of interest. The RF blocking characteristics of the RF filter may be tuned by using an additional inductor to create an LC bandpass filter. Other RF filter designs using active and/or passive components may also be employed. Such RF filters, with and without the use of an inductor, are well-known to those skilled in the art.

Figure 5:
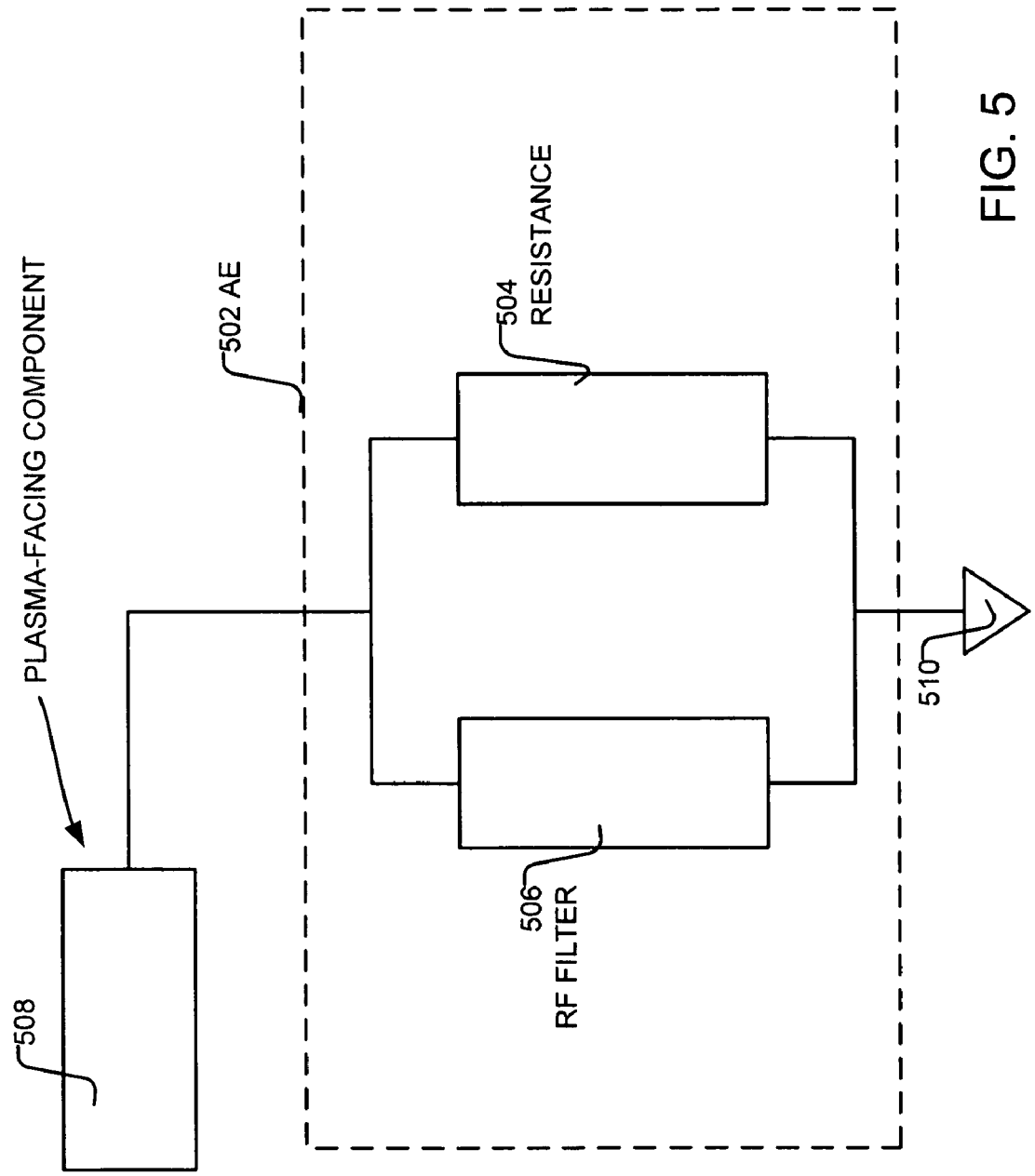
FIG. 5 shows, in accordance with one embodiment of the present invention, a circuit diagram for an arc-eliminating (AE) arrangement that also inhibits RF radiation.

FIG. 5 shows, in accordance with one embodiment of the present invention, a circuit diagram for an arc-eliminating (AE) arrangement that also inhibits RF radiation. AE arrangement 502 includes an appropriately sized resistance circuit 504 coupled in parallel with an appropriately sized RF filter circuit 506. When AE arrangement 502 is interposed in the current path between a plasma-facing component 508 and the ground terminal 510, with the plasma-facing component 508 otherwise electrically isolated from ground terminal 510, both the arcing and the radiation of the RF energy is substantially eliminated.

One would assume that the value of the resistance circuit should be as high as possible so as to maximize the voltage drop across that resistance circuit (e.g., VR1 of FIG. 4B) and therefore minimize the DC potential difference between the plasma and the plasma-facing component (e.g., VB of FIG. 4B). As mentioned, it is the DC potential difference between the plasma and the plasma-facing component that is primarily responsible for the arcing phenomenon. However, it should be noted that an excessively high value of R1 will cause VR1 to be unduly high, which means that the DC potential of the plasma-facing component will be high during and even after processing. A very high DC potential on a given component in the chamber represents a potential electrocution hazard. Furthermore, the high DC potential is also seen across the RF filter circuit, which may employ some type of capacitance circuit in its design. If the capacitance is charged up to a high voltage and not discharged, or is given insufficient time to discharge, the possibility of electrocution may exist. Thus, the value of R1 should be chosen so as to minimize the DC potential difference between the plasma and the plasma-facing component during processing but not to the point where an unnecessary high voltage potential exists on the plasma-facing component and/or across the capacitance circuit of the RF filter and becomes a hazard to the human operator or other devices in the tool environment.

Figure 8:
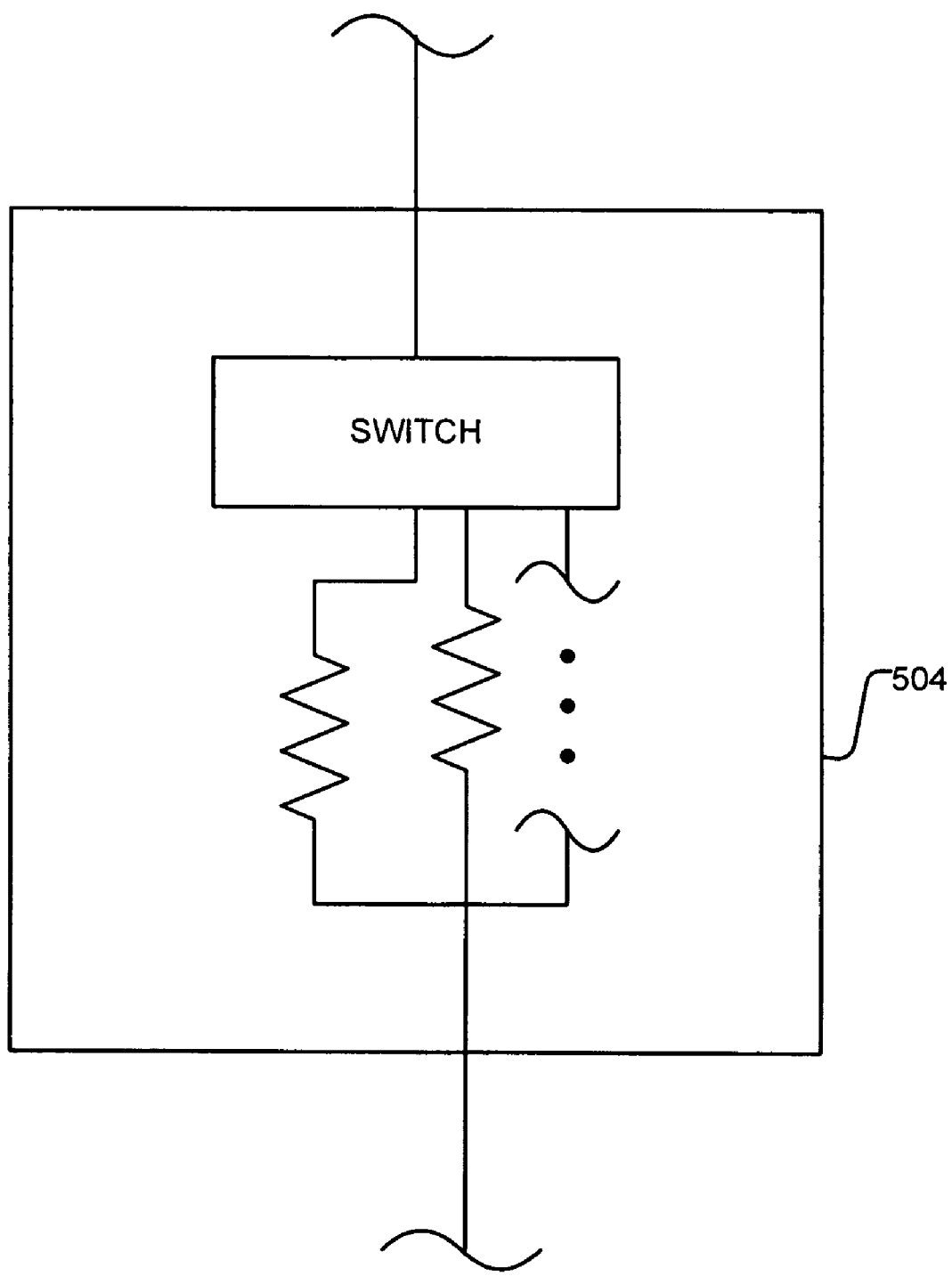
FIG. 8 shows, in accordance with an embodiment of the invention, a resistance circuit comprising a plurality of resistors and a switching arrangement.

In its simplest form, the resistance circuit may simply be an appropriately sized resistor, e.g., a ceramic resistor. One should note that the resistance circuit may be constructed out of devices other than a simple passive resistor. For example, a range of resistors may be provided, and a switching mechanism or arrangement may be provided to facilitate switching among different resistor values to change the potential difference to vary the non-arcing window for a given process or for different steps of a given process. An example of such a design is shown in FIG. 8. For the purpose of tuning the resistance value to account for different chamber designs, different materials for the plasma-facing components, and/or different process parameters, a variable resistor may be employed instead. As another example, it may be possible to employ a transistor to implement a variable resistance circuit to raise the DC voltage of the plasma-facing component by a requisite amount (e.g., by varying the gate voltage of the transistor which affects the conductive channel between the source and the drain). In fact, any circuit design that provides the requisite resistance value may also be employed. These other resistance circuits are known in the art and will not be discussed in details herein.

Likewise, in its simplest form, the RF filter circuit may simply be an appropriately sized capacitor. The value of the capacitor should be sufficiently large such that the RF voltage on the plasma-facing component can be kept relatively low, preferably below the level where RF radiation would interfere with other devices in the processing tool environment. However, there is an upper limit to the capacitance value for any chamber design since an unduly large capacitor would draw an excessively high RF current, possibly destroying the capacitor itself.

One should note that the RF filter circuit may be constructed out of devices other than a simple capacitor. For the purpose of tuning the RF filter to account for different chamber designs and/or different materials for the plasma-facing components, and/or to selectively block out or let pass RF signals having certain RF frequencies, a tunable RF filter circuit may be employed instead. In fact, any circuit design that provides the requisite RF filter characteristics may be employed. These other RF filter circuits, whether they employ passive and/or active components, are known in the art and will not be discussed in details herein.

The spatial distribution of the low RF impedance circuits and the high DC resistance circuits are also important for certain plasma-facing components. If the plasma-facing component is relatively small (e.g., a gas injector nozzle, a probe, and the like), a single two-terminal AE arrangement may be employed, with one of its terminals connected to a location on the plasma-facing component and the other terminal connected to ground. For larger plasma-facing components and/or for plasma-facing components having more complex shapes, multiple RF filters may be provided to eliminate RF "hot spots" on the plasma-facing component. Multiple RF filters are also advantageous in that they allow the requisite capacitance value to be divided among many parallely connected RF filters, thereby lowering the capacitance value associated with an individual RF filter. Multiple parallelly connected RF filters may also be better at handling a large RF current, which is advantageous from a cost and reliability standpoint. At a lower capacitance value, there may be more choices among the commercially available capacitors and/or the aggregate cost for the multiple capacitors may be lower than the cost of a single high performance capacitor.

Figure 6:
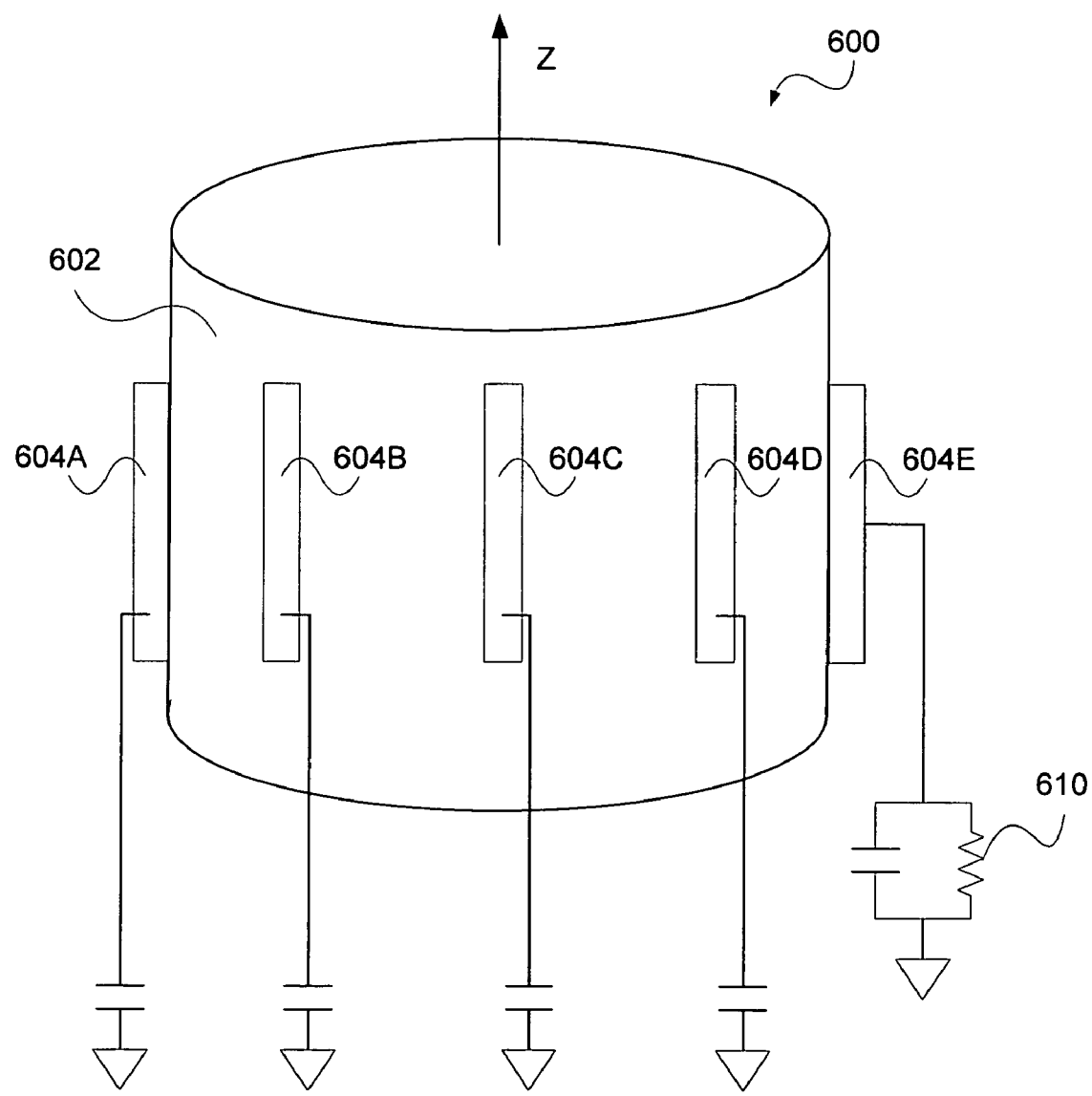
FIG. 6 shows, in accordance with one aspect of the present invention, an AE arrangement for a cylindrical chamber wall of an inductively coupled plasma processing chamber

In accordance with one aspect of the present invention, FIG. 6 shows an AE arrangement 600 for a cylindrical chamber wall 602 of an inductively coupled plasma processing chamber. In the example of FIG. 6, chamber wall 602 is electrically isolated from the ground terminal except through AE arrangement 600. AE arrangement 600 includes multiple wall-contacting modules 604 spatially distributed around the chamber wall circumference. Each wall-contacting module 604 is preferably made out of a conductive material such as aluminum and is shaped to distribute the electrical contact surface for the DC voltage and the RF signal along the vertical (z) axis of the chamber wall 602. An exemplary individual wall-contacting modules 604 is discussed in greater detail in FIG. 7 hereinbelow.

In a preferred embodiment, each of the wall-contacting modules 604 is provided with a RF filter circuit, which is in the form of a capacitor in the implementation of FIG. 6. By distributing the wall contacting modules 604 and thus the RF filter circuits along the circumference of chamber wall 602, RF "hot spots" are minimized. Furthermore, the use of multiple capacitors distributed along the circumference of chamber wall 602 allows the use of a smaller capacitance value for each of the capacitors, which reduces cost and improves reliability as mentioned earlier. In one exemplary implementation, 16 wall-contacting modules are provided. However, if RF hot spots are not a problem and fewer capacitors can reliably keep the RF voltage of the plasma-facing component low to the point where RF radiation no longer poses a problem, only a few or even one RF filter circuit may be necessary.

Each wall-contacting module 604 may also be provided with a resistance circuit to provide a separate path to ground for the DC signal. The resistance circuit takes the form of an appropriately sized resistor, for example. However, it is found that for a low resistivity SiC chamber wall, there is no need to distribute the resistors around the circumference of chamber wall 602 in order to eliminate arcing. In one case, a single appropriately sized resistor 610 provided with one of the wall-contacting modules 604E is sufficient, and other wall-contacting modules may not require the use of a resistance circuit.

In one exemplary implementation, each of the sixteen capacitors on the sixteen wall-contacting modules has a capacitance value that is 390 pF each for a total of 6.24 nF. However, this is for an inductively coupled plasma etching chamber having a low resistivity SiC chamber wall, with an upper electrode running at about 4 MHz and a lower electrode running at about 13.56 MHz during processing. For this case, the total capacitance value may be between about 0 pF (i.e., no capacitor) and about 100 nF, more preferably between about 10 pF and about 30 nF and even more preferably between about 1 nF and about 10 nF. Of course the total capacitance value may vary depending on, for example, the chamber design, the process parameters and the size of the plasma-facing component being protected. For example, a smaller plasma-facing component may require a smaller capacitor than that required by a larger plasma-facing component. If no capacitance is employed, it is contemplated that an alternative method may be implemented to contain the RF, for example by providing a Faraday shield around the component and/or the chamber that radiates the RF.

The single resistor in the exemplary implementation has a value of about 500 k$\Omega$. However, the resistance value may be between about 1 k$\Omega$ and about 100 M$\Omega$, more preferably between about 10 k$\Omega$ and about 10 M$\Omega$ and even more preferably between about 100 k$\Omega$ and about 1 M$\Omega$. Of course the resistance value may vary depending on, for example, the chamber design, the process parameters, other electrical characteristics of the plasma-facing component being protected and the like.

Figure 7:
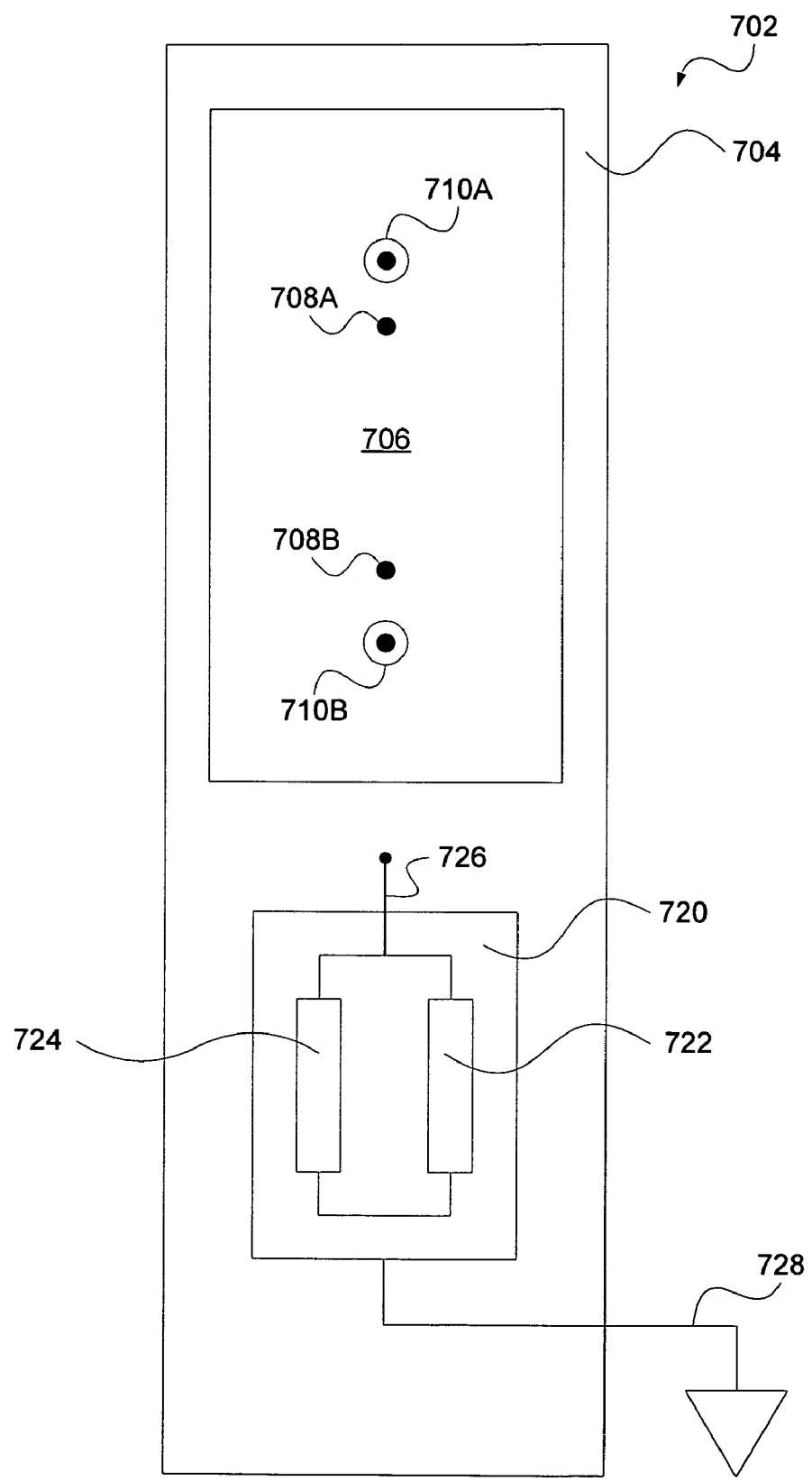
FIG. 7 shows, in accordance with one embodiment of the present invention, the details of a wall-contacting module.

FIG. 7 shows, in accordance with one embodiment of the present invention, the details of a wall-contacting module 702. In the case of wall-contacting module 702, both the resistance circuit (in the form of an appropriately sized resistor) and the RF filter circuit (in the form of an appropriately sized capacitor) are present. As mentioned earlier, however, the use of a resistance circuit is not necessary with every wall-contacting module provided at least one of the wall-contacting module is provided with a resistance circuit.

In FIG. 7, the side of the wall-contacting module that faces away from the chamber wall exterior is shown. Wall-contacting module 702 includes a conductive base 704, which is made out of aluminum or another suitable conductive material. The length of conductive base 704 may be adjusted to provide electrical contact along as much of the height of the chamber wall as necessary to avoid RF hot spots. The wall-facing side of wall-contacting module 702 may be provided with a RF gasket to further improve RF contact between base 704 and the chamber wall.

A non-conductive portion 706 made out of, for example, plastic or another suitable non-conductive material is provided and is coupled to base 704 using screws 708A and 708B. External mounts 710A and 710B are then coupled to non-conductive portion 706. External mounts 710A and 710B provide the mechanical mounting points to secure the processing chamber, through the wall contacting modules 702 attached thereto, to the frame of the processing system. Since the frame of the processing system is typically grounded, the fact that these external mounts are coupled only to the non-conductive portion of the wall-contacting modules means that the wall-contacting modules and thus the chamber wall are electrically isolated from ground while being securely mounted to the frame of the processing tool.

An AE arrangement 720 in the form of a PCB board is mounted on base 704. AE arrangement 720 includes a resistor 722 coupled in parallel with a capacitor 724. One end of the RC pair is electrically coupled to base 702 via a conductor 726. The other end of the RC pair is electrically connected to ground via a conductor 728 as shown.

Although FIG. 7 shows the application of an AE arrangement to eliminate arcing to the chamber wall, it should be noted that the inventive arc elimination techniques disclosed herein may be applied to eliminate arcing to any other plasma-facing component. Examples of these plasma-facing components include, without limitation, focus rings, hot edge rings, pressure control devices, chamber liners, probes, gas injector nozzles. In one embodiment, the inventive arc elimination techniques may also be applied to the substrate to eliminate arcing thereto. In one exemplary case, an appropriate contact arrangement (e.g., a spring-loaded pin or multiple pins) may be provided to provide the RF and DC current paths to the substrate.

Furthermore, the inventive arc elimination techniques disclosed herein are not limited only to inductively coupled plasma processing chambers. It is contemplated that any plasma processing chamber component that experiences arcing may be addressed using the inventive arc elimination techniques irrespective of how the plasma is generated and/or sustained. For example, the inventive arc elimination techniques disclosed herein may well be employed to reduce arcing to the top electrodes of capacitive etchers. Furthermore, the plasma elimination techniques disclosed herein may be employed plasma processing systems operating at any RF frequencies.

Even for processes that do not experience arcing within a certain process window, the implementation of the inventive arc elimination techniques widen that process window, allowing the process engineers to employ higher RF power and/or RF voltages, which may result in a better process result whereas these higher RF power and/or RF voltage ranges may have been avoided in the past because of the arcing problem.

Still further, the inventive arc elimination techniques disclosed herein may be applied to any plasma-facing component irrespective of its composition. Applying the inventive AE arrangements to a plasma-facing component that is otherwise electrically isolated from ground modifies its electrical properties as far as susceptibility is arcing is concerned. Thus, the material of the plasma-facing component may now be selected based on its superior properties in other regards such as chemical inertness, ease of manufacturing, high purity, low cost, desirable mechanical characteristics, ready availability, and the like without regard that material's susceptibility to arcing.

As such, it is contemplated that the inventive arc elimination techniques may be applied to plasma-facing components made of materials such as silicon carbide (SiC), silicon (Si), aluminum, stainless steel (i.e., alloys of iron and chromium and optionally nickel, molybdenum, tungsten, copper, silicon, and/or others), and/or other metals and their alloys, boron carbide (B4C), graphite (C), yttrium oxide and other yttria-based materials. Further, the inventive arc elimination techniques may be applied to porous, solid, composite (i.e., multi-layered of the same or different materials), or pure forms of these materials, irrespective of how these materials are deposited, created, or manufactured (such as chemical vapor deposition, plasma-enhanced chemical vapor deposition, sputtered, sintered, plasma-sprayed, pressed, machined, and/or cast). For example, the inventive arc elimination techniques also apply to material that is made up of multiple layers (e.g., aluminum with an aluminum oxide layer). Accordingly, one can now chose a material on account of its desirable chemical properties, mechanical properties, and/or other considerations such as low cost, availability, ease of manufacturing and fabrication, and the like without regard to that material's susceptibility to arcing during processing. If arcing happens to be a problem during processing, the inventive arc elimination techniques may then be employed to eliminate such arcing.

Thus, while this invention has been described in terms of several preferred embodiments, there are alterations, permutations, and equivalents which fall within the scope of this invention. It should also be noted that there are many alternative ways of implementing the methods and apparatuses of the present invention. It is therefore intended that the following appended claims be interpreted as including all such alterations, permutations, and equivalents as fall within the true spirit and scope of the present invention.

What is claimed is:

1. A method for configuring a plasma processing chamber for processing a substrate to form electronic components thereon, said plasma processing chamber including at least a plasma-facing component, said plasma-facing component having a plasma-facing surface oriented toward a plasma in said plasma processing chamber during said processing said substrate, said method comprising:

electrically isolating said plasma-facing component from a ground terminal;

coupling said plasma-facing component to a grounding arrangement, said grounding arrangement comprising a first resistance circuit disposed in a first current path between said plasma-facing component and said ground terminal;

including an RF filter arrangement in said grounding arrangement;

coupling said first resistance circuit in parallel with said RF filter arrangement; and distributing a plurality of wall-contacting modules along a circumference of said plasma-facing component, each wall-contacting module of said plurality of wall-contacting modules including a conductive base and a resistor-capacitor module, said resistor-capacitor module being electrically coupled with said conductive base through a first conductor and being disposed on said conductive base, said resistor-capacitor module including at least a resistor and a capacitor, said resistor being electrically coupled in parallel with said capacitor;

attaching said conductive base to an exterior surface of said plasma-facing component, said external surface of said plasma-facing component being opposite to said plasma-facing surface; and electrically grounding said resistor-capacitor module through a second conductor.

2. The method of claim 1 wherein said plasma-facing component is a chamber wall enclosing a chuck for supporting said substrate.

3. The method of claim 1 wherein said first resistance circuit includes a variable resistor.

4. The method of claim 1 wherein said grounding arrangement includes a plurality of resistance circuits having different resistance values and a switching arrangement, said switching arrangement being configured for selecting one of said plurality of resistance circuits for use as said first resistance circuit.

5. The method of claim 1 wherein a resistance value of said first resistance circuit is selected to substantially eliminate arcing between said plasma and said plasma-facing surface during said processing of said substrate.

6. The method of claim 1 wherein said plasma-facing component is formed from a material that comprises substantially of boron carbide ($B_4C$).

7. The method of claim 1 wherein said plasma-facing component is formed from a material that comprises substantially of silicon (Si).

8. The method of claim 1 wherein said plasma-facing component is formed from a material that comprises substantially of graphite (C).

9. The method of claim 1 wherein said plasma-facing component is formed from a material that comprises a metal.

10. The method of claim 9 wherein said metal is aluminum.

11. The method of claim 9 wherein said metal is steel.

12. The method of claim 1 wherein said plasma-facing component is formed from a material that comprises substantially of silicon carbide (SiC).

13. The method of claim 1 wherein said plasma-facing component is formed from multiple layers of material.

14. The method of claim 1 wherein said plasma-facing component is formed from a material that includes yttrium.

15. The method of claim 1 wherein said plasma-facing component is formed from a material that includes silicon carbide (SiC).

16. The method of claim 15 wherein said plasma processing chamber is an inductively-coupled plasma processing chamber.

17. The method of claim 16 wherein said plasma-facing component is a substantially cylindrical structure disposed around at least a portion of said plasma.

18. The method of claim 17 wherein said processing said substrate includes etching said substrate using said plasma.

19. The method of claim 1 further comprising:

adjusting a length of said conductive base to maximize electrical contact between said grounding arrangement and said plasma-facing component along a height of said plasma-facing component, wherein said plasma-facing component is a chamber wall enclosing a chuck for supporting said substrate.

20. The method of claim 1 further comprising reducing a capacitance value for said capacitor.

21. The method of claim 1 wherein said RF filler arrangement includes a variable capacitor.

22. The method of claim 1 wherein a value of said first resistance circuit is between about 1 K$\Omega$ and about 100 M$\Omega$ during said processing.

23. The method of claim 1 wherein a capacitance value of said RF filter arrangement is between about 1 pF and about 100 nF during said processing.

24. The method of claim 1 wherein a value of said first resistance circuit is between about 10 K$\Omega$ and about 10 M$\Omega$ during said processing.

25. The method of claim 1 wherein a capacitance value of said RF filter arrangement is between about 100 pF and about 30 nF during said processing.

26. The method of claim 1 wherein a value of said first resistance circuit is between about 100 K$\Omega$ and about 1 M$\Omega$ during said processing.

27. The method of claim 1 wherein a capacitance value of said RF filter arrangement is between about 1 nF and about 10 nF during said processing.

28. The method of claim 1 wherein said plasma-facing component is one of a chamber wall, a plasma screen, a gas injector nozzle, and a chamber liner.

29. The method of claim 1 wherein said plasma processing chamber is a capacitively-coupled plasma processing chamber and said plasma-facing component is a top electrode.

30. The method of claim 1 wherein said grounding arrangement further includes a plurality of capacitors disposed in a plurality of parallel current paths between said plasma-facing surface and said ground terminal.

31. The method of claim 30 wherein said plurality of capacitors are arranged so as to improve distribution of capacitive grounding of said plasma-facing component with respect to at least one surface of said plasma-facing component.

32. The method of claim 31 wherein a value of said first resistance circuit is between about 100 K$\Omega$ and about 1 M$\Omega$ and a capacitance value of one of said plurality of capacitors is between about 1 nF and about 10 nF.

33. The method of claim 31 wherein said plasma-facing component is a substantially cylindrical structure disposed around at least a portion of said plasma.

* * * * *